(12) United States Patent
Murin et al.

(10) Patent No.: US 8,009,472 B2
(45) Date of Patent: Aug. 30, 2011

(54) METHOD FOR ADAPTIVE SETTING OF STATE VOLTAGE LEVELS IN NON-VOLATILE MEMORY

(75) Inventors: Mark Murin, Kfar Saba (IL); Menahem Lasser, Kohav-Yair (IL)

(73) Assignee: SanDisk IL Ltd., Kfar Saba, IL (US)

( * ) Notice: Subject to any disclaimer, the term of this patent is extended or adjusted under 35 U.S.C. 154(b) by 0 days.

(21) Appl. No.: 12/890,267

(22) Filed: Sep. 24, 2010

(65) Prior Publication Data

US 2011/0013450 A1   Jan. 20, 2011

Related U.S. Application Data

(63) Continuation of application No. 12/111,729, filed on Apr. 29, 2008, now Pat. No. 7,808,819.

(51) Int. Cl.
*G11C 16/04* (2006.01)
(52) U.S. Cl. ......... 365/185.03; 365/185.18; 365/185.22; 365/185.24; 365/185.02
(58) Field of Classification Search ............. 365/185.03, 365/365.18, 185.22, 185.24, 285.02
See application file for complete search history.

(56) References Cited

U.S. PATENT DOCUMENTS

| | | | |
|---|---|---|---|
| 5,386,422 A | 1/1995 | Endoh et al. |
| 5,570,315 A | 10/1996 | Tanaka et al. |
| 5,774,397 A | 6/1998 | Endoh et al. |
| 6,046,935 A | 4/2000 | Takeuchi et al. |
| 6,222,762 B1 | 4/2001 | Guterman et al. |
| 6,278,633 B1 | 8/2001 | Wong et al. |
| 6,456,528 B1 | 9/2002 | Chen |
| 6,522,580 B2 | 2/2003 | Chen et al. |
| 6,813,194 B2 | 11/2004 | Tran |
| 6,859,391 B1 | 2/2005 | Combe et al. |
| 7,020,017 B2 | 3/2006 | Chen et al. |
| 7,085,183 B2 | 8/2006 | Yang et al. |
| 7,167,395 B1 | 1/2007 | Kobernik et al. |
| 7,187,585 B2 | 3/2007 | Li et al. |
| 7,212,435 B2 | 5/2007 | Rudeck et al. |
| 7,237,074 B2 | 6/2007 | Guterman et al. |
| 7,259,993 B2 | 8/2007 | Redaelli et al. |

(Continued)

OTHER PUBLICATIONS

International Preliminary Report on Patentability dated Nov. 2, 2010, International Application No. PCT/IL2009/000449 filed Apr. 27, 2009.

(Continued)

*Primary Examiner* — Tuan Nguyen
*Assistant Examiner* — Toan Le
(74) *Attorney, Agent, or Firm* — Vierra Magen Marcus & DeNiro LLP

(57) ABSTRACT

A method in which non-volatile memory device is accessed using voltages which are customized to the device, and/or to portions of the device, such as blocks or word lines of non-volatile storage elements. The accessing can include programming, verifying or reading. By customizing the voltages, performance can be optimized, including addressing changes in threshold voltage which are caused by program disturb. In one approach, different sets of storage elements in a memory device are programmed with random test data. A threshold voltage distribution is determined for the different sets of storage elements. A set of voltages is determined based on the threshold voltage distribution, and stored in a non-volatile storage location for subsequent use in accessing the different sets of storage elements. The set of voltages may be determined at the time of manufacture for subsequent use in accessing data by the end user.

29 Claims, 10 Drawing Sheets

U.S. PATENT DOCUMENTS

| | | |
|---|---|---|
| 7,310,271 B2 | 12/2007 | Lee |
| 7,623,386 B2 | 11/2009 | Dong et al. |
| 7,796,439 B2 * | 9/2010 | Arai et al. ............... 365/185.22 |
| 7,808,819 B2 | 10/2010 | Murin et al. |
| 7,808,836 B2 | 10/2010 | Murin et al. |
| 2003/0169621 A1 | 9/2003 | Kawamura |
| 2004/0170058 A1 | 9/2004 | Gonzalez et al. |
| 2005/0024939 A1 | 2/2005 | Chen et al. |
| 2005/0057967 A1 | 3/2005 | Khalid et al. |
| 2005/0210184 A1 | 9/2005 | Chen et al. |
| 2006/0279990 A1 | 12/2006 | Wan et al. |
| 2007/0159891 A1 | 7/2007 | Tu |
| 2007/0242510 A1 | 10/2007 | Hemink |
| 2007/0242524 A1 | 10/2007 | Hemink |
| 2009/0268516 A1 | 10/2009 | Murin et al. |

OTHER PUBLICATIONS

Claims in Preliminary Amendment filed Jan. 6, 2011, Japanese National Stage Patent Application of PCT/IL2009/000449.

Response to the Written Opinion of the ISA dated Jan. 17, 2011, European Patent Application No. 09738566.0 filed Apr. 27, 2009.

International Search Report and Written Opinion of the International Searching Authority dated Aug. 19, 2009, PCT Patent Application No. PCT/IL2009/000449.

Office Action dated Mar. 30, 2010, U.S. Appl. No. 12/111,729, filed Apr. 29, 2008.

Amendment dated Apr. 21, 2010, U.S. Appl. No. 12/111,729, filed Apr. 29, 2008.

Notice of Allowance dated Jun. 25, 2010, U.S. Appl. No. 12/111,729, filed Apr. 29, 2008.

Supplemental Notice of Allowability dated Jul. 20, 2010, U.S. Appl. No. 12/111,729. filed Apr. 29, 2008.

Notice of Allowance dated Jun. 11, 2010, U.S. Appl. No. 12/111,748, filed Apr. 29, 2008.

Office Action dated May 17, 2011, European Patent Application No. 09 738 566.0-1233 filed Apr. 27, 2009.

* cited by examiner

Fig. 7
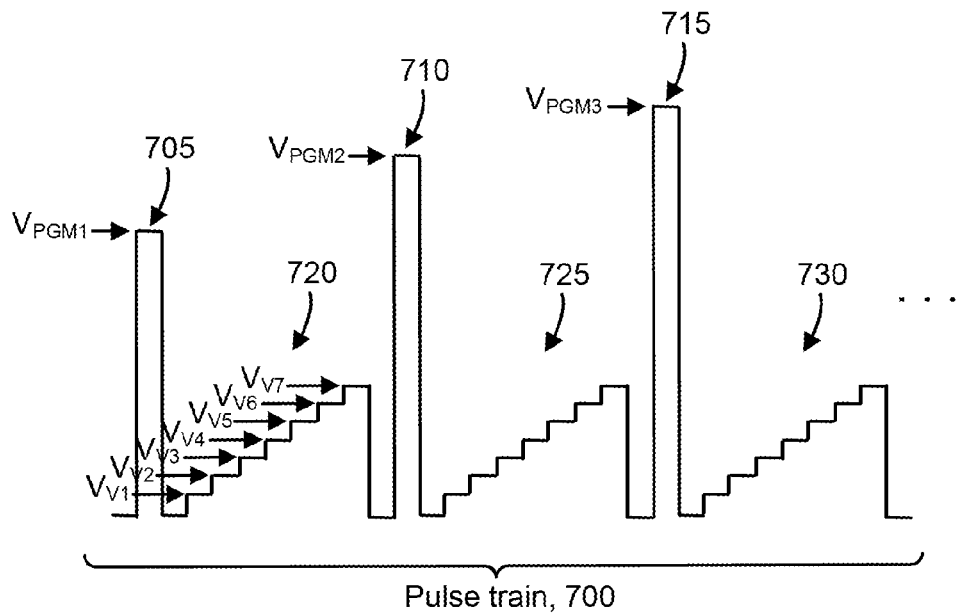
Pulse train, 700
Fig. 8a
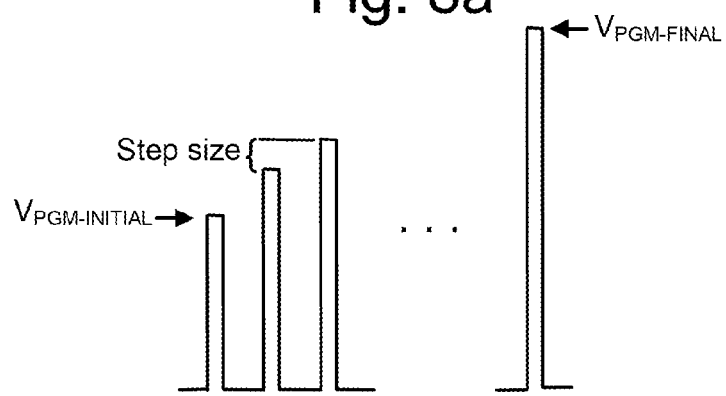
Fig. 8b
| Set: | Program voltages: | Verify voltages: | Read voltages: |
|---|---|---|---|
| 1 | $V_{PGM-1}$ | $V_{v1-1}, V_{v2-1},...$ | $V_{R1-1}, V_{R2-1},...$ |
| 2 | $V_{PGM-2}$ | $V_{v1-2}, V_{v2-2},...$ | $V_{R1-2}, V_{R2-2},...$ |
| ⋮ | | | |
| i | $V_{PGM-i}$ | $V_{v1-i}, V_{v2-i},...$ | $V_{R1-i}, V_{R2-i},...$ |

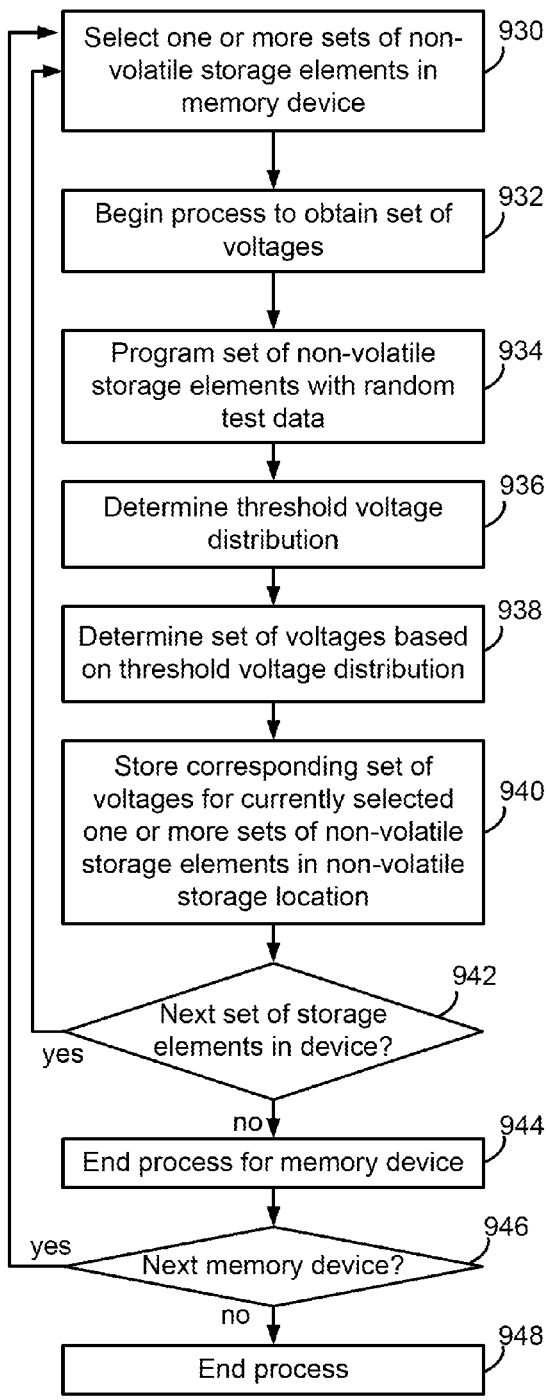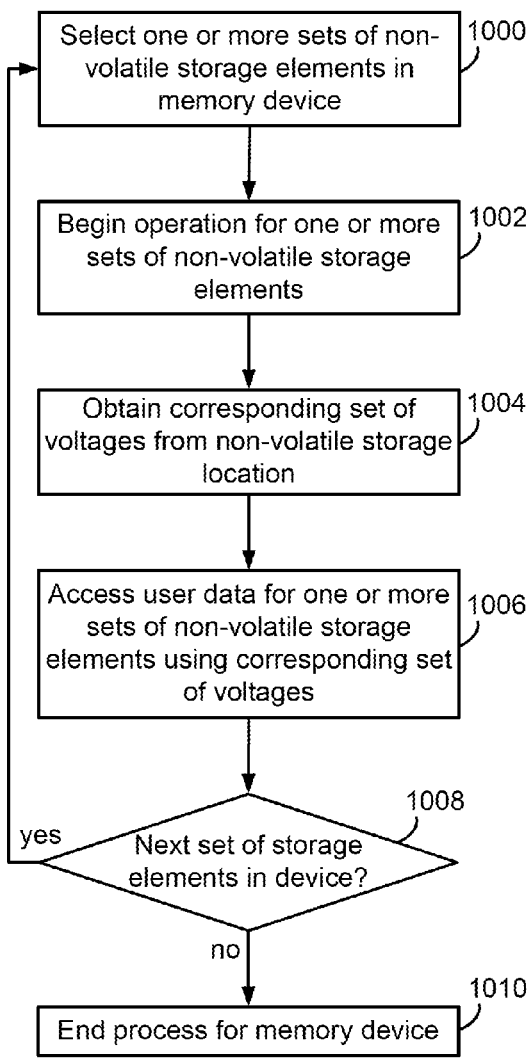

METHOD FOR ADAPTIVE SETTING OF STATE VOLTAGE LEVELS IN NON-VOLATILE MEMORY

CROSS-REFERENCE TO RELATED APPLICATIONS

This is a continuation application of commonly assigned U.S. patent application Ser. No. 12/111,729, filed Apr. 29, 2008, which will issue as U.S. Pat. No. 7,808,819 on Oct. 5, 2010, incorporated herein by reference.

This application is also related to commonly assigned U.S. patent application Ser. No. 12/111,748, filed Apr. 29, 2008, which will issue as U.S. Pat. No. 7,808,836 on Oct. 5, 2010, incorporated herein by reference.

BACKGROUND OF THE INVENTION

1. Field of the Invention

The present invention relates to a memory device.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

Conventionally, memories that store one bit per cell are called 'single level cell" (SLC) memories, and memories that store more than one bit per cell are called "multi level cell" (MLC) memories. For example, each MLC memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

Further, during a read operation, read reference voltages are applied to a set of storage elements to be read, and a determination is made as to which read reference voltage causes a storage element to become conductive. The read reference voltages are set to allow data states of the storage elements to be distinguished.

However, voltages which are used during programming, verifying and reading are typically fixed and do not account for the fact that the threshold voltage distribution can vary. For example, threshold voltage distribution can vary due to issues such as program disturb. As a result, the use of fixed programming, verifying and reading voltages results in non-optimized performance.

SUMMARY OF THE INVENTION

The present invention provides a method for setting voltage levels, such as for write, read and verify operations, in a non-volatile storage system, to optimize performance.

In one embodiment, a method for configuring a memory device includes measuring respective threshold voltage distributions for respective sets of non-volatile storage elements in the memory device, where the non-volatile storage elements are multi-level storage elements. The method further includes determining a respective set of voltages for each respective set of non-volatile storage elements based on the respective threshold voltage distribution, where the respective set of voltages is customized for the respective set of non-volatile storage elements. The method further includes storing, in a non-volatile storage location, each set of voltages, and after the storing, obtaining at least one of the respective sets of voltages from the non-volatile storage location, and performing a write operation involving at least one of the respective sets of non-volatile storage elements using the at least one of the respective sets of voltages.

In another embodiment, a method for configuring a memory device includes measuring respective threshold voltage distributions for respective sets of non-volatile storage elements in the memory device, where the non-volatile storage elements are multi-level storage elements, and the measuring includes writing data to the respective sets of non-volatile storage elements. The method further includes determining a respective set of voltages for each respective set of non-volatile storage elements based on the respective threshold voltage distribution, where the respective set of voltages is customized for the respective set of non-volatile storage elements. The method further includes storing, in a non-volatile storage location, each set of voltages, and after the storing, obtaining at least one of the respective sets of voltages from the non-volatile storage location, and accessing at least one of the respective sets of non-volatile storage elements using the at least one of the respective sets of voltages.

In another embodiment, a method for configuring separate memory devices includes, for each respective memory device: (a) measuring one or more respective threshold voltage distributions for one or more respective sets of non-volatile storage elements in the memory device, where the non-volatile storage elements are multi-level data storage elements, (b) determining a respective set of voltages for each respective set of non-volatile storage elements based on the respective threshold voltage distribution, (c) storing the respective set of voltages for each respective set of non-volatile storage elements in a corresponding respective non-volatile storage location, and (d) after the storing, obtaining at least one of the respective sets of voltages from the respective non-volatile storage location, and performing a write operation involving the one or more respective sets of non-volatile storage elements using the at least one of the respective sets of voltages. The respective sets of voltages are customized to each respective set of non-volatile storage elements, and vary among the plurality of separate memory devices.

In another embodiment, a method for configuring separate memory devices includes, for each respective memory device: (a) measuring one or more respective threshold voltage distributions for one or more respective sets of non-volatile storage elements in the memory device, where the non-volatile storage elements are multi-level storage elements, and the measuring includes writing data to the one or more respective sets of non-volatile storage elements, (b) determining a respective set of voltages for each respective set of non-volatile storage elements based on the respective threshold voltage distribution, (c) storing the respective set of voltages for each respective set of non-volatile storage elements in a respective non-volatile storage location, and (d) after the storing, obtaining at least one of the respective sets of voltages from the respective non-volatile storage location, and accessing the one or more respective sets of non-volatile storage elements using the at least one of the respective sets of voltages. The respective sets of voltages are customized to each respective set of non-volatile storage elements, and vary among the plurality of separate memory devices.

Corresponding methods, systems and computer- or processor-readable storage devices for performing the methods provided herein are provided.

BRIEF DESCRIPTION OF THE DRAWINGS

FIG. 7 depicts a pulse train of programming voltages and verify voltages.

FIG. 8a depicts a series of write or program voltages which can be used during programming.

FIG. 8b depicts data including write, verify and read voltages customized for different sets of non-volatile storage elements.

FIG. 9b depicts a process for accessing user data of a set of non-volatile storage elements using predetermined voltages determined by the process of FIG. 9a.

FIG. 9c depicts a process for determining voltages for multiple sets of non-volatile storage elements.

FIG. 10 depicts a process for accessing user data of multiple sets of non-volatile storage elements using predetermined voltages determined by the process of FIG. 9c.

DETAILED DESCRIPTION

The present invention provides a method for setting voltage levels, such as for write, read and verify operations, in a non-volatile storage system, to optimize performance.

Figure 1:
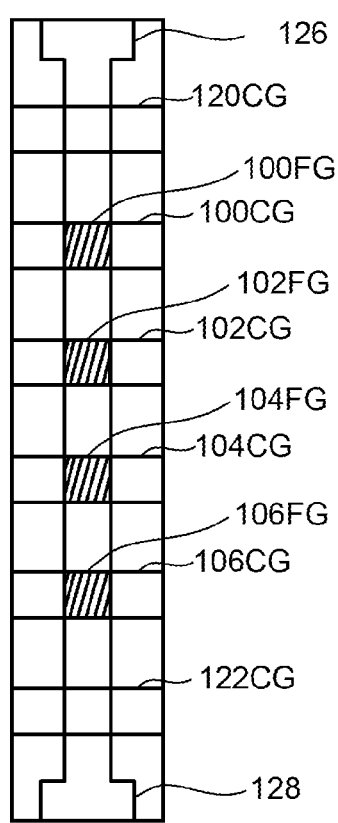
FIG. 1 is a top view of a NAND string.
Figure 2:
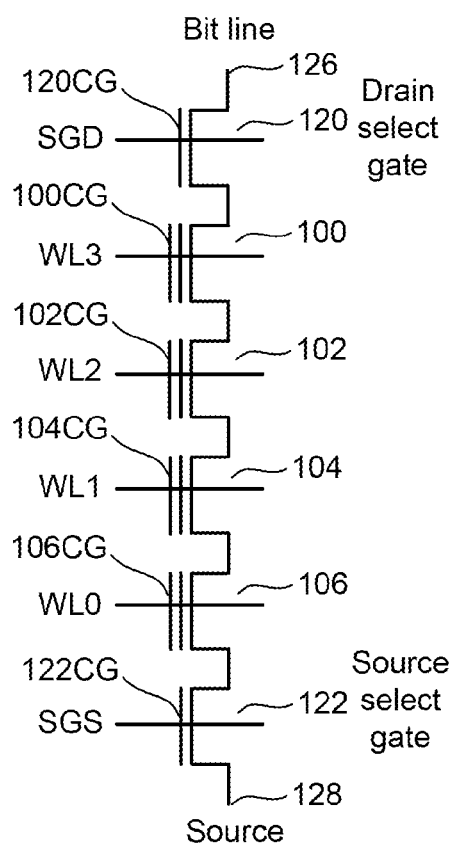
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
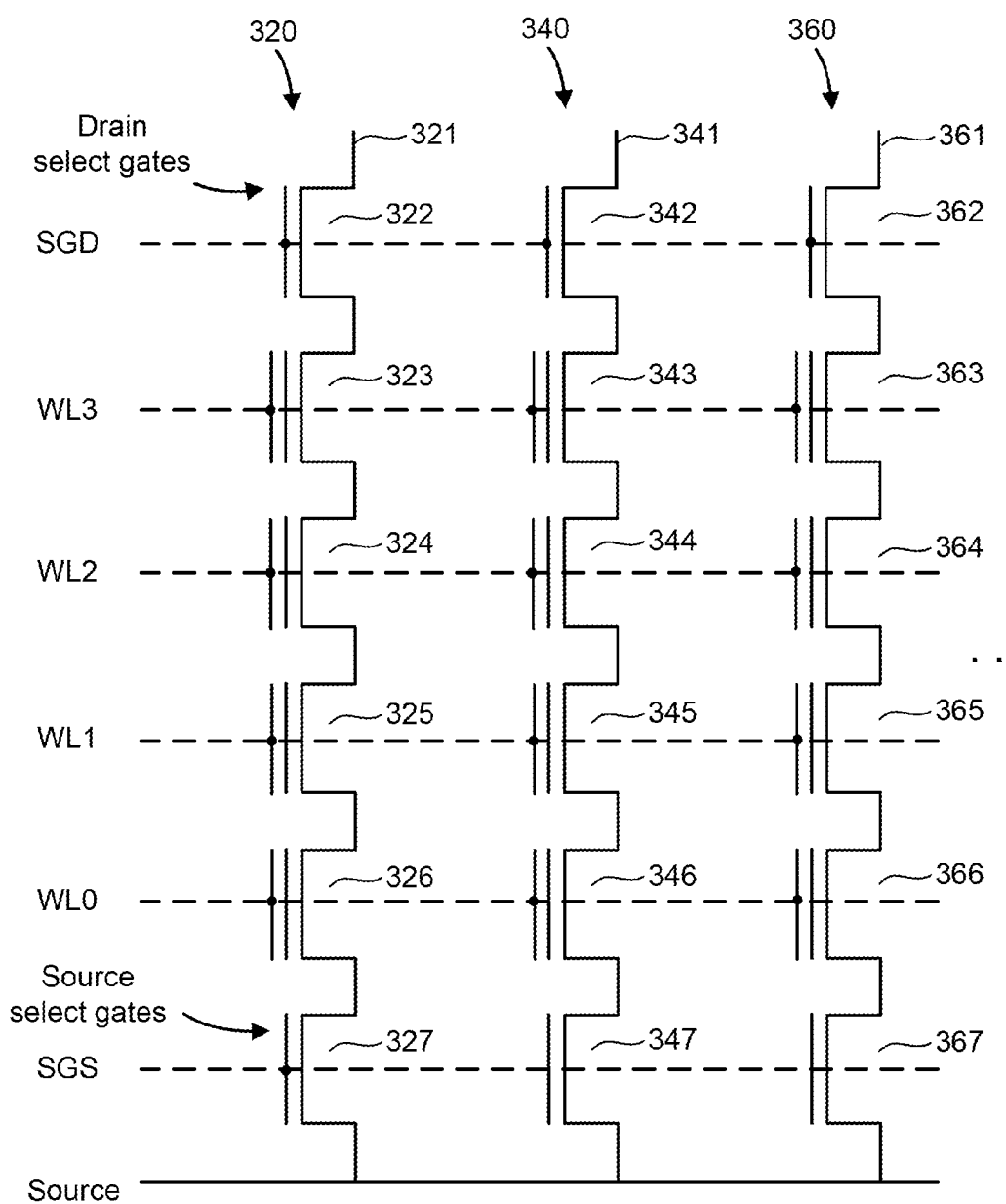
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Pat. No. 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364. The unselected storage elements 344 and 364 are subject to program disturb. Program disturb occurs when an unselected storage element on the same word line as a selected storage element is inadvertently programmed due to application of a relatively high program voltage on the selected word line.

Figure 4:
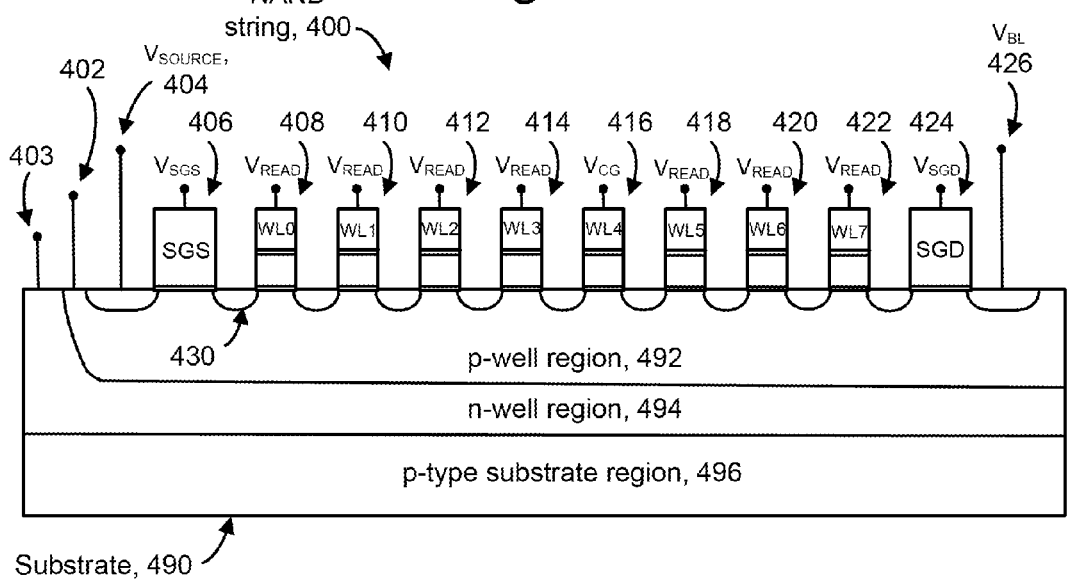
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages can also be applied to the p-well region 492 via a terminal 402 and to the n-well region 494 via a terminal 403.

During a read operation, a control gate voltage $V_{CG}$ is provided on a selected word line, in this example, WL3, which is associated with storage element 414 and other storage elements which are not shown. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$ is applied to the remaining word lines associated with NAND string 400, in one possible scheme. $V_{SGS}$ and $V_{SGD}$ are applied to the select gates 406 and 424, respectively.

Figure 5:
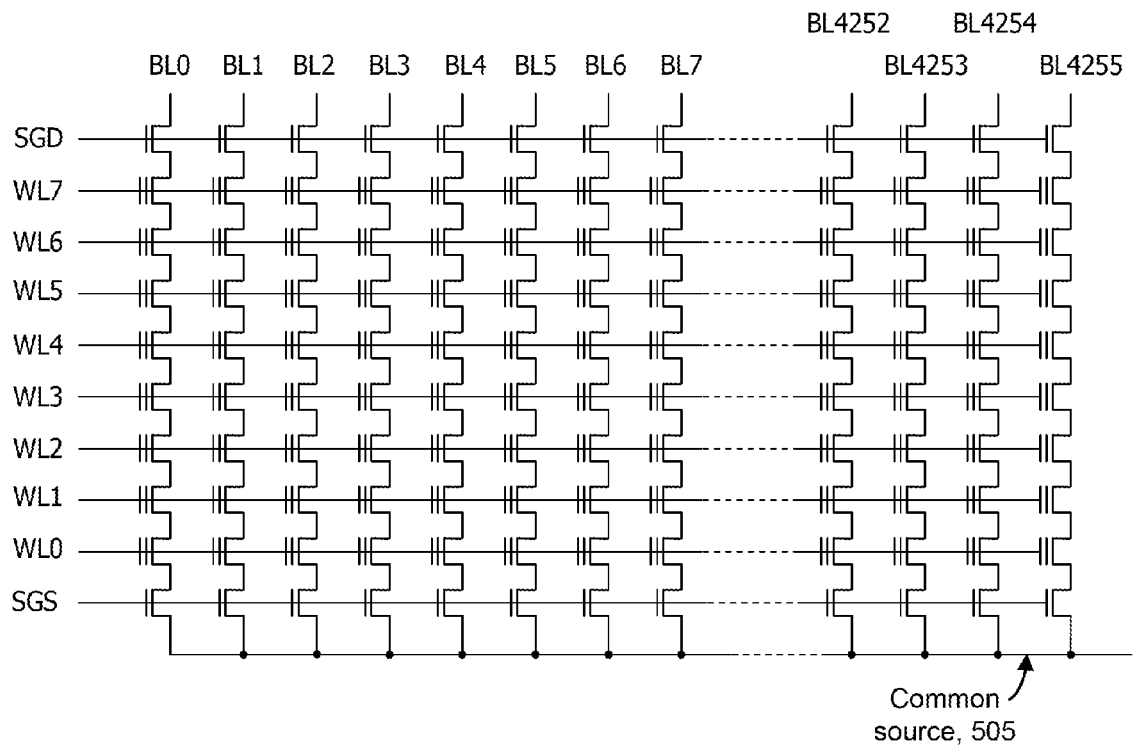
FIG. 5 depicts a block of storage elements.

FIG. 5 depicts a block of storage elements. In one example implementation, a NAND flash EEPROM can be partitioned into 1,024 blocks. The data stored in each block can be simultaneously erased. In one embodiment, the block is the minimum unit of storage elements that are simultaneously erased. In each block, in this example, there are 4,256 columns corresponding to bit lines BL0, BL1, ... BL4255. In one embodiment referred to as an all bit line (ABL) architecture, all the bit lines of a block can be simultaneously selected during read and program operations, and storage elements along a common word line and connected to any bit line can be programmed at the same time.

In the example provided, eight storage elements are connected in series to form a NAND string, and there are eight data word lines WL0 through WL7. A NAND string can also include dummy storage elements and associated word lines. In other embodiments, the NAND strings can have more or less than eight data storage elements. Data memory cells can store user or system data. Dummy memory cells are typically not used to store user or system data.

One terminal of each NAND string is connected to a corresponding bit line via a drain select gate (connected to select gate drain line SGD), and another terminal is connected to a common source 505 via a source select gate (connected to select gate source line SGS). Thus, the common source 505 is coupled to each NAND string.

In one embodiment, referred to as an odd-even architecture, the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. In each block, the columns are divided into even columns and odd columns.

During one configuration of read and programming operations, 4,256 storage elements are simultaneously selected. The storage elements selected have the same word line and are thus part of a common physical page. Therefore, 532 bytes of data, which also form a logical page, can be read or programmed simultaneously, and one block of the memory can store at least eight logical pages. In this example, a physical page and a logical page are the same but, in general, this is not required. For example, a physical page can include multiple logical pages. A logical page is typically the smallest set of storage elements that are written (programmed) simultaneously. For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on one block at a time, or in some flash memory devices—a few blocks at a time. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines are raised to a read pass voltage, $V_{READ}$, (typically a voltage in the range of 4.5 to 6 V) to make the transistors operate as pass gates. The selected word line is connected to a voltage, a level of which is specified for each read and verify operation, to determine whether a $V_{TH}$ of the concerned storage element is above or below such level. For example, in a read operation for a two-level storage element, the selected word line may be grounded, so that it is detected whether the $V_{TH}$ is higher than 0 V. In a verify operation for a two level storage element, the selected word line is connected to 0.8 V, for example, so that it is verified whether or not the $V_{TH}$ has reached at least 0.8 V. The source and p-well are at 0 V. The selected bit lines are pre-charged to a level of, for example, 0.7 V. If the $V_{TH}$ is higher than the read or verify level on the word line, the potential level of the bit line associated with the storage element of interest maintains the high level because of the non-conductive storage element. On the other hand, if the $V_{TH}$ is lower than the read or verify level, the potential level of the concerned bit line decreases to a low level, for example, less than 0.5 V, because the conductive storage element discharges the bit line. The state of the storage element can thereby be detected by a voltage comparator sense amplifier that is connected to the bit line, in one possible implementation. As with programming, read operations can be performed on a per-page basis.

Many details of erase, read and verify operations described above are performed according to techniques known in the art. Thus, many of the details explained can be varied by one skilled in the art. Other erase, read and verify techniques known in the art can also be used.

Figure 6A:
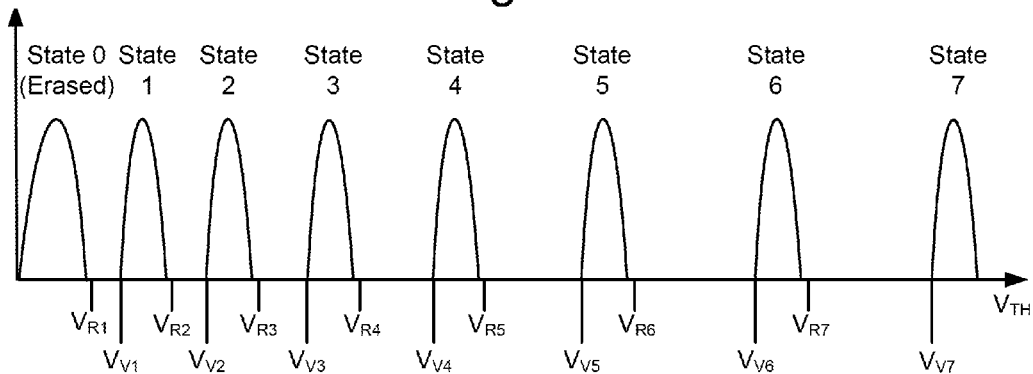
FIG. 6a depicts an initial threshold voltage distribution of a set of non-volatile storage elements, with corresponding verify and read voltages.
Figure 6B:
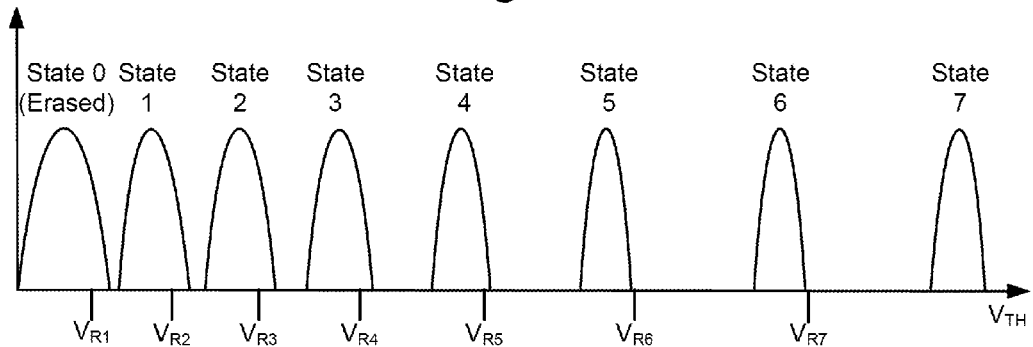
FIG. 6b depicts the threshold voltage distribution of a set of non-volatile storage elements experiencing program disturb.
Figure 6C:
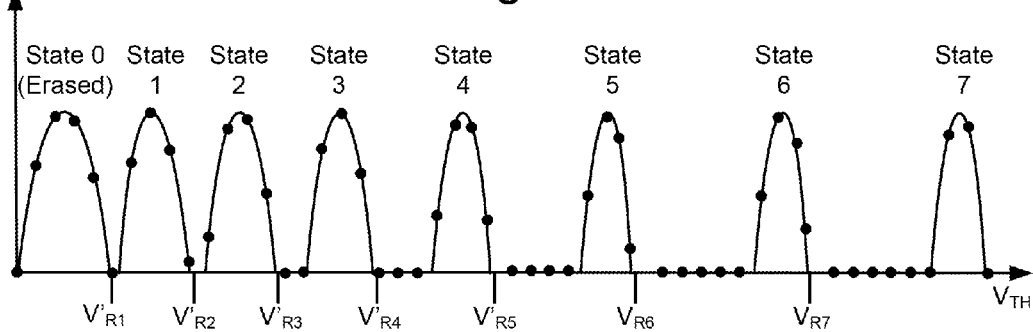
FIG. 6c depicts measurement of the threshold voltage distribution of FIG. 6b and setting of corresponding read voltages.

FIGS. 6a-c relate to how program disturb can change the threshold voltage distribution of a set of non-volatile storage elements, and to a process for addressing this issue. FIG. 6a depicts an initial threshold voltage distribution of a set of non-volatile storage elements, with corresponding verify and read voltages. The threshold voltage of a storage element is the lowest voltage that, when applied to the control gate of the storage element, changes the channel state from a non-conducting state to a conducting state. This voltage is affected by the amount of negative charge trapped in the floating gate: the more charge, the higher the threshold voltage of the cell.

The most common kind of Multi Level Cell (MLC)-type devices uses four charge amounts in the floating gate, including zero charge, so the state can be represented by four voltage levels, thus a MLC storage element stores two bits of data. Generally, N bits per storage element can be represented using $2^N$ voltage levels. Newer devices are expected to use eight or more voltage levels. Using a high number of bits per storage element allows the production of flash devices with high data density and thus reduces the overall cost per flash device. Note that multi-level data storage is distinguished from multi-bit data storage such as used in some NROM devices. Such multi-bit data storage involves charge levels which each correspond to a 0 or 1. Multi-level data storage involves a range of charge levels which correspond to 00, 01, 10 and 11 when the MLC storage element stores two bits of data, for instance.

The read operation in a MLC device with four states uses three reference voltage levels, an MLC device with eight states uses seven reference voltage levels, and, generally, a device that stores N bits per cell, that are represented by $2^N$ states, uses $2^N-1$ reference voltage levels for read operations.

In FIG. 6a, the graph includes an x-axis which represents a threshold voltage and a y-axis which represents a number of storage elements. The example MLC device includes eight states, state 0 through state 7, associated verify voltages $V_{V1}$ through $V_{V7}$ and associated read voltages $V_{R1}$ through $V_{R7}$. The distribution for each state is relatively narrow as each storage element is programmed to a desired voltage group. Further, the corresponding reference voltages for reading the storage elements, e.g., $V_{R1}$ through $V_{R7}$, are between the voltage groups, typically just above the previous distribution, e.g., $V_{R1}$ is between state 0 and state 1, just above the distribution of state 0, $V_{R2}$ is between state 1 and state 2, just above the distribution of state 1, and so forth.

As mentioned, program disturb can cause significant changes in threshold voltage distribution. Program disturb occurs when an unselected storage element on the same word line as a selected storage element is inadvertently programmed due to application of a relatively high program voltage on the selected word line. Program disturb thus tends to raise the threshold voltage of a storage element. Moreover, the lowest state, e.g., the erased state, tends to be raised the most and therefore can serve as a worst case indicator of the amount of program disturb which has been experienced in a set of storage elements. Measurements performed on flash memory devices show that the amount of program disturb varies significantly between different memory devices, between different blocks within the same device and even between different word lines within the same block. In order to assure the best performance of all the memory devices in terms of reliability (e.g., smallest number of errors), it is desirable to either keep program disturb at a similar level for all the devices or to adapt the voltage levels (e.g., verify and/or read) to the actual value of program disturb in a specific device, block and/or word line. A technique is provided herein for controlling program disturb and for matching the program disturb to the verify and/or read voltage levels. More generally, the technique customizes the verify and/or read voltage levels which are used for accessing a set of storage elements.

FIG. 6b depicts the threshold voltage distribution of a set of non-volatile storage elements experiencing program disturb. The read reference voltages $V_{R1}$ through $V_{R7}$ which are depicted are the same as in FIG. 6a. Here, the threshold voltage distribution for lower states is wider and shifted upwards compared to the distribution shown in FIG. 6a due to program disturb. Program disturb is significant mostly for low voltage states while upper states generally do not suffer from program disturb. Note that the distributions for adjacent data states can also overlap in some cases. Here, it can be seen that read errors can result if the same read voltages of FIG. 6a are used to read the data states represented in FIG. 6b, at least for read voltages $V_{R1}$-$V_{R5}$ in this example. Each of the read voltages $V_{R1}$-$V_{R5}$ is overlapped by a lower threshold voltage distribution. In contrast, the read voltages $V_{R6}$ and $V_{R7}$ are not overlapped by a lower threshold voltage distribution in this example.

Further, the effects of program disturb can be different for different sets of storage elements. For example, the threshold voltage distribution of different sets of storage elements can vary, such as on a device, block and/or word line level. Accordingly, if the same, fixed set of read voltages is used, this can result in non-optimal results, such as causing errors during read operations. Moreover, other factors such as temperature changes and number of programming/erasing cycles, and the relative location of a storage element in a block, such as based on a storage element's proximity to the source or drain of a NAND string, can influence program disturb.

FIG. 6c depicts measurement of the threshold voltage distribution of FIG. 6b and setting of corresponding read voltages.

The process of measuring the actual threshold distribution involves reading the memory device in separate read operations, where the number of read operations is based on the desired resolution of the distribution measurement. If, for example, the memory device uses eight states, representing three bits per storage element, and a resolution of ten points per state is desired, then read operations are performed for each of seventy-nine voltage threshold levels. In FIG. 6c, each dot represents a read point, and the solid line is the same as in FIG. 6b. A histogram can be provided in which the height of each bin indicates the number of storage elements whose threshold voltage is in a range specified by the bin. The most appropriate read level for a given set of storage elements can be determined, e.g., as the minima between adjacent states. When there is a range of minima, the most appropriate read level between two data states can be just above the distribution of the lower of the two states. Here, the read levels $V'_{R1}$ through $V'_{R5}$ have been shifted to optimal levels relative to the levels of FIG. 6b, while $V_{R6}$ and $V_{R7}$ are unchanged. If the read levels of FIG. 6b were used, substantial read errors would result. Generally, it is desirable to put the read level as close as possible to the previous level to also allow for maximum data retention shift.

Generally, obtaining a "threshold voltage distribution" of a set of storage elements involves dividing the range of threshold voltages of the storage elements to multiple sub-ranges, and then counting the respective numbers of occurrences of storage elements in each sub-range. It is possible to count the occurrences of all, or only a portion, of the storage elements in the set of storage elements. It is also possible to count the occurrences for only a portion of the sub-ranges, e.g., one or more sub-ranges, and extrapolating the result to other sub-ranges.

In one approach, an on-line evaluation of the program disturb for a current device, block and/or word line, and adjustment of the voltage level settings for the evaluated program disturb, is provided. The actual program disturb of each manufactured memory device can be measured on a block-by-block basis, for instance, and a match can be made between the voltage level settings (read and verify voltages for different data states) and the program disturb measured for that block. These "matched-per-block" voltage level settings can then be used for subsequent program and read operations. In order to handle program disturb, one has to modify verify voltages, or read voltages, or both.

The value of program disturb can be defined as the width of the threshold voltage distribution of the erase state in a page for which all the data states are present. That is, the data programmed to the page includes representation of all the possible data states. The threshold voltage distribution may be considered up to certain percentile of cells, in accordance with ECC correction capabilities. The program disturb value may be obtained by programming random, for example, data to the memory device, then reading the threshold voltage distribution of all the data states and considering the width of the erased state. A default voltage level setting can be used for this programming.

Once the width of the erase level threshold voltage distribution is obtained, voltage level settings for the remaining data states may be determined. There may be two approaches for computation of voltage levels, namely a "fixed program disturb" and a "fixed voltage window" approach. Both approaches have the same principle.

First, we identify the voltage window available for all the data states except for the erased state. The available voltage window can be defined as a distance between the "end" (rightmost) voltage of the erased state (e.g., the program disturb value) and the verify voltage of the highest possible data state, which is $V_{V7}$ when there are eight data states. The voltage window can also be defined as starting at the lowest (leftmost) voltage of the erase state.

Second, we divide this window between the data states proportionally to a relative data retention shift of these states. The data retention shift of storage elements for certain conditions of a block (e.g., write/erase cycling) and a given retention time depends on the storage element threshold voltage—the higher the threshold voltage, the larger the shift. Quantitative characteristics of this dependence are technology specific and may be obtained by testing and/or theoretical calculations, for instance. The division of the available voltage window between data states may be in accordance with these characteristics.

Third, we determine the read level and verify level for each state, based on the above. The difference between the two above-mentioned approaches is as follows. In the fixed program disturb approach, the program disturb value is tuned to a pre-determined fixed value by modifying the voltage window, e.g., by modifying the verify voltage level of the highest data state. The program disturb phenomenon is caused by a stress induced on the storage elements in the erased state by the high programming voltage which is applied to the word line during programming. Further, program disturb is higher when the programming voltage applied to the word line is higher, such as when a selected storage element is being programmed to the highest data state. This means that program disturb can be controlled by changing the verify level of the highest data state. An iterative procedure may be implemented to obtain the desired program disturb value. For example, if program disturb is too high, we can reduce the verify level of the highest data state. Then, the program disturb is determined again, e.g., by determining a threshold voltage distribution, to determine if it is close to a desired level. If the program disturb is still too high, we can reduce the verify level of the highest data state again.

Note that the verify levels of all of the states can be related to one another by a known function, which is linear or non-linear, and the available voltage window. For example, due to the higher data retention loss of the higher states, the verify levels are typically set to provide relatively more spacing for higher states than for lower states. Thus, once the entire voltage window is known, we can compute the read or verify voltages.

In the fixed voltage window approach, the verify level of the highest data state remains fixed at a default value, resulting in a program disturb as measured, which can be different from word line to word line, block to block and/or device to device. A variable program disturb value can result in a variable state width for the rest of the data states.

The procedure of adjusting the voltage level settings can be performed at the manufacturing stage of the memory device, or after the memory device has been shipped to the end user, in example approaches. Further, the adjustment can be repeated at different times if desired. Or, the adjustment can be performed only once for the life of the memory device. In fact, program disturb is lessened as the memory device undergoes additional program-erase cycles, so that subsequent adjustment may not be needed.

For example, once the device is shipped to the end user, the adjustment can be triggered by different events, such as temperature changes, passing of a number of programming cycles, passing of a certain amount of time since data was last written, and so forth. Appropriate tracking components and/or processes are provided for this purpose. In one approach, the adjusted voltage values can be stored in the memory device for each device block using a reliable programming method which is similar to storing of flash internal parameters at a ROM fuse. These block-specific values can further be retrieved and used in a normal operation of the memory device, when a block is being addressed for programming or reading.

Thus, in one approach, customized sets of read and/or verify voltages can be determined once for a set of storage elements in a memory device, such as at the time of manufacture. The set of voltages can be stored in a non-volatile storage location in the memory device and subsequently accessed each time a read or programming operation is performed. See FIGS. 9a-9c and FIG. 10 for further details.

FIG. 7 depicts a pulse train 700 of programming voltages and verify voltages. The programming voltages increase in amplitude in a step wise manner, e.g., starting at a program pulse 705 having an amplitude of $V_{PGM1}$, followed by a program pulse 710 having an amplitude of $V_{PGM2}$, a program pulse 715 having an amplitude of $V_{PGM3}$, and so forth. After each program pulse, a series of verify voltages $V_{V1}$ through $V_{V7}$ is applied, as depicted by waveforms 720, 725 and 730. These verify voltages can be customized to a given set of storage elements as discussed in connection with FIGS. 6a-c.

Write voltages can also be customized for different sets of non-volatile storage elements. FIG. 8a depicts a series of write or program voltages which can be used during programming. The intermediate verify voltages are omitted for clarity. As mentioned, write voltages generally begin at an initial level, $V_{PGM-INITIAL}$, and increase in amplitude according to a step size, until all the storage elements have been programmed to their correspondent states or a final voltage, $V_{PGM-FINAL}$, is reached, the earliest of the two. In one approach, one or more write voltage parameters can be customized for a particular set of storage elements. For example, if the threshold voltage distribution of a set of storage elements with lower states indicates that the threshold voltage for such states is mostly above the expected value, or the width of threshold distribution is higher, than expected, we can conclude that the programming effect is stronger than average. In these cases, we can reduce the write voltages by reducing $V_{PGM-INITIAL}$ and/or the step size. In some cases, pulses at the maximum allowable $V_{PGM-FINAL}$ or at lower levels may be repeated. Analogous adjustments can be made if the programming effect is weaker than average for a set of storage elements, e.g., in case of reaching $V_{PGM-FINAL}$ before all the storage elements have been programmed to their correspondent states. Such adjustments can include increasing $V_{PGM-INITIAL}$, the step size, and/or the maximum allowable $V_{PGM-FINAL}$. It should be noted, that the step size directly affects the width of the distribution states, so that if the width of each distribution is wider than average, the step size can be reduced, and if the width of each distribution is narrower than average, the step size can be increased, e.g., to achieve faster programming.

FIG. 8b depicts data including write, verify and read voltages customized for different sets of non-volatile storage elements. As mentioned, write, verify and/or read voltages can be customized for different sets of storage elements. The optimum voltages for each set of storage elements can be determined and stored for subsequent use. For example, voltages for a particular memory device, block word line and/or group of word lines in the memory device can be stored in a non-volatile storage location of the memory device. Here, write voltages for a first set of storage elements, set 1, are represented by $V_{PGM-1}$, verify voltages are represented by $V_{V1-1}, V_{V2-1}$, and so forth, and read voltages are represented by $V_{R1-1}, V_{R2-1}$, and so forth. Further, $V_{PGM-1}$ can represent one or more of: $V_{PGM-INITIAL}$, the step size and $V_{PGM-FINAL}$ for set 1. Each of these three variables can be tailored to different sets of storage elements. Similarly, write voltages for a second set of storage elements, set 2, are represented by $V_{PGM-2}$ (e.g., denoting one or more of: $V_{PGM-INITIAL}$, the step size and $V_{PGM-FINAL}$ for set 2), verify voltages for a second set of storage elements are represented by $V_{V2-1}, V_{V2-2}$, and so forth, and read voltages are represented by $V_{R1-2}, V_{R2-2}$, and so forth. Generally, programming voltages for an ith set of storage elements, set i, are represented by $V_{PGM-i}$ (e.g., denoting one or more of: $V_{PGM-INITIAL}$, the step size and $V_{PGM-FINAL}$ for set i) and so forth, while verify voltages for an ith set of storage elements are represented by $V_{V1-i}, V_{V2-i}$, and so forth, and read voltages are represented by $V_{R1-i}, V_{R2-i}$, and so forth.

Figure 9A:
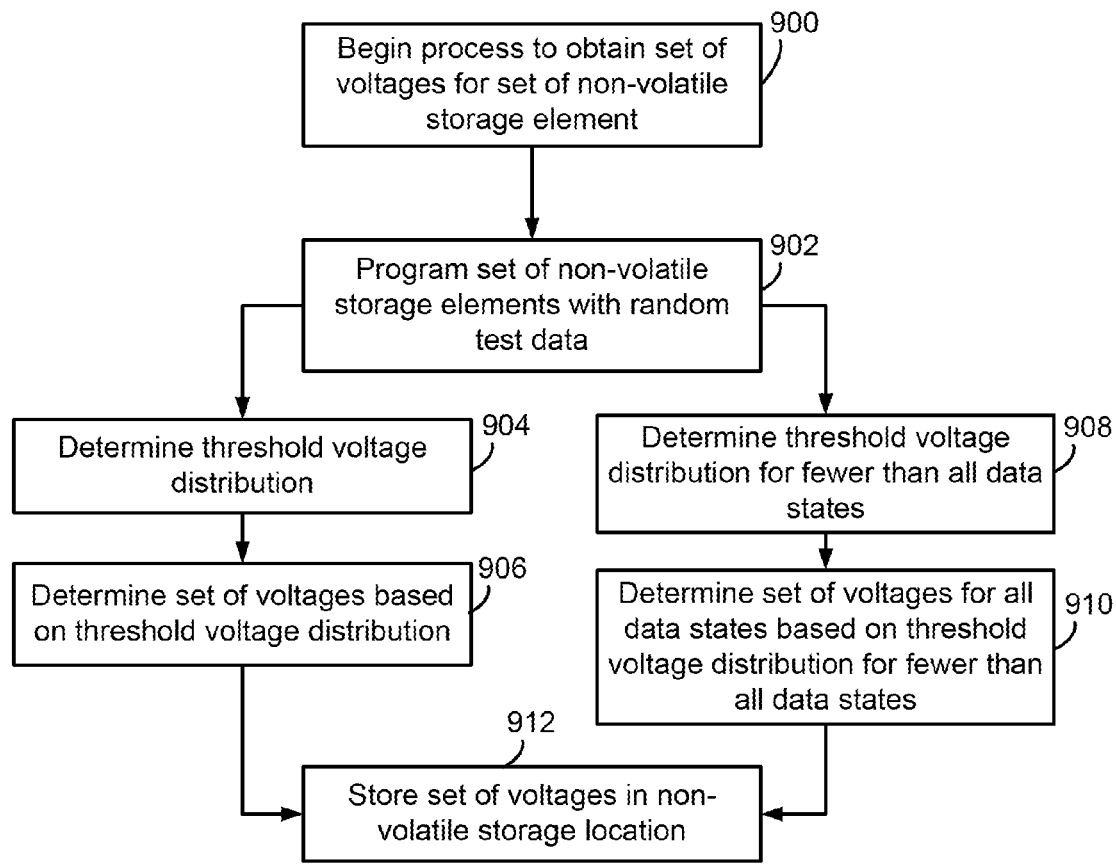
FIG. 9a depicts a process for determining voltages for a set of non-volatile storage elements.

FIG. 9a depicts a process for determining voltages for a set of non-volatile storage elements. Step 900 includes beginning a process to obtain a set of voltages (e.g., read, verify and/or write voltages) for a set of non-volatile storage elements. The set can represent, e.g., the storage elements which are associated with one or more particular word lines in a block having multiple word lines, the storage elements which are associated with a particular block in a memory device having multiple blocks, or the storage elements which are associated with a particular memory device overall. Step 902 includes programming the set of non-volatile storage elements with random test data, in one approach. The test data should include all data states. For example, such test data may be available when the memory device undergoes testing at the manufacturing site before being shipped. After the memory device has been shipped, if no test data is available, then existing user data may be programmed instead. The user data may be scrambled as well so that it represents all data states relatively evenly. For example, user data which is present in one location of a memory device, such as a given block, can be copied to another location, such as another block which includes the particular set of storage elements for which the read/verify voltages are to be determined.

After step 902, one of two paths may be followed. In a first path, step 904 includes determining a threshold voltage distribution of the set of storage elements, e.g., by performing read operations at different incremental voltage threshold levels, as depicted in FIG. 6c. Generally, this can involve determining the threshold voltage distribution of all data states. Step 906 includes determining a set of voltages based on the threshold voltage distribution. For example, a set of read voltages may be determined based on minima of the threshold voltage distribution, as depicted in FIG. 6c. A set of verify voltages may be determined based on the voltage window. For instance, the voltage window may be determined from the threshold voltage distribution, and the verify voltages determined from a function which provides a desired relative spacing between verify voltages within the constraint of the overall voltage window. Step 912 includes storing data which identifies the set of voltages in a non-volatile storage location. For example, the data of the set of voltages can be stored in storage elements in the memory device from which the threshold voltage distribution was obtained. These can be storage elements which do not store user data, for instance. In one approach, the data is stored in storage elements of a block from which the threshold voltage distribution was obtained. In another approach, the data is stored in storage elements of a word line from which the threshold voltage distribution was obtained. Or, a non-volatile storage location which is used by a controller of the memory device may be used. Other locations may be used as well.

In a second path, step 908 includes determining the threshold voltage distribution of the set of storage elements for fewer than all data states. For instance, the threshold voltage distribution of the erased state may be determined. As mentioned, the upper edge of the threshold voltage distribution of the erased state can used to measure the level of program disturb as this state is most susceptible to program disturb. An optimum read level for state 1 can be determined based on this upper edge, and optimum read levels for the remaining states can be determined based on a known relationship between the read levels for the states. That is, a formula may be used which relates the optimum read level for state i (i>2) to the optimum read level for state 1. It is also possible to determine the threshold voltage distribution of the set of storage elements for multiple data states, such as for states 1 and 2, and relate these to the other states. For example, a formula may be used which relates the optimum read level for state i (i>3) to the optimum read levels for states 1 and 2. Such formulas may be obtained from theoretical relationships and/or experimental test results. Step 910 thus includes determining a set of voltages based on the threshold voltage distribution for fewer than all data states.

Further, the data of the set of voltages can be represented in any manner. FIG. 8b, discussed previously, provides one possible example. An identifier of the set of storage elements may also be used in some cases, as depicted (e.g., set 1, 2, ..., i). For example, a controller may have a storage location which stores a different set of voltages for each block in the corresponding device, or for groups of blocks in the device. In this case, an identifier of the set of storage elements may be associated with each set of voltages. In other cases, the location of the set of voltages serves as an identification of the storage elements to which the voltages apply, e.g., a set of voltages stored in a block can apply to that block, or a set of voltages stored in a word line can apply to that word line. In another example, sets of voltages of different blocks are stored in one block, in which case an identifier may be needed to associate a block with its corresponding set of voltages. In some cases, the sets of voltages can be stored so that their relative position in the storage location identifies the storage elements to which the voltages apply. For instance, a first position in the storage location may correspond to a first block, while a second position in the storage location corresponds to a second block, and so forth. Or, the storage location may be in a block, where a first position in the storage location may correspond to a first word line or set of word lines in the block, while a second position in the storage location corresponds to a second word line or set of word lines in the block, and so forth.

Also, absolute values of the voltages may be stored, or offset values may be stored which represent offsets from a reference set of values or from a single reference value. Or, data which is used for directly controlling a voltage circuit may be used, such as a binary code word which is input to a digital-to-analog converter. In any case, such data is understood to represent the set of voltages.

The technique provided herein advantageously does not require the use of reference storage elements, which are additional storage elements which store non-user data for the purpose of tracking threshold voltage changes which a device has experienced. The reference storage elements consume additional space in a memory device beyond the storage elements which store user data. Reference storage elements are typically read "on the fly" so that each time a page of data is read an adjustment takes place. In this case, there is no storing of a set of voltages in a non-volatile storage location for subsequent use. Moreover, typically reference storage elements do not involve measuring threshold voltage distributions. With reference storage elements, measurements are made on one set of storage elements, e.g., the reference storage elements, for use in determining voltages of a second, non-overlapping set of storage elements. In contrast, with the technique provided herein, measurements are made, and voltages are determined, for the same set of storage elements which are subsequently accessed using the voltages.

Figure 9B:
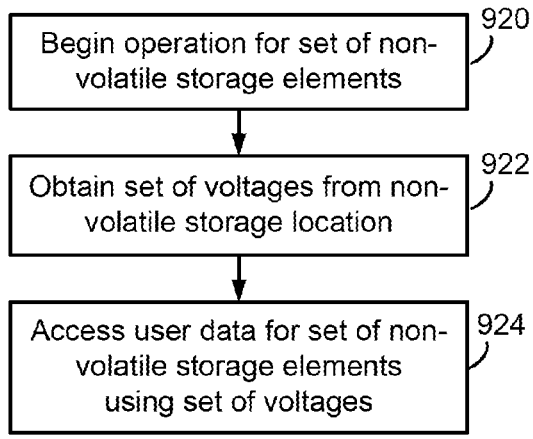

FIG. 9b depicts a process for accessing user data of a set of non-volatile storage elements using predetermined voltages determined by the process of FIG. 9a. In one approach, the accessing may occur after the memory device has been shipped to the user, that is, after the device has been manufactured and installed in a host system which is used by a user. Step 920 includes beginning an operation (e.g., program, verify or read) for a set of non-volatile storage elements. Step 922 includes obtaining the set of voltages from the non-volatile storage location. Step 924 includes accessing user data for the set of non-volatile storage elements using the set of voltages. Such accessing can include programming/verifying or reading.

FIG. 9c depicts a process for determining voltages for multiple sets of non-volatile storage elements. As mentioned, voltages can be customized for different sets of storage elements, including within a single memory device and among different memory devices. Many of the steps are analogous to those in FIG. 9a. Step 930 includes selecting one or more sets of non-volatile storage elements in a memory device. Step 932 includes beginning the process to obtain a corresponding set of voltages. Step 934 includes programming the set of non-volatile storage elements with random test data. Step 936 includes determining a threshold voltage distribution for the one or more sets of non-volatile storage elements. Step 938 includes determining a set of voltages based on the threshold voltage distribution. Step 940 includes storing the corresponding set of voltages for the currently selected one or more sets of non-volatile storage elements in a non-volatile storage location. At decision step 942, if there is a next set of storage elements in the memory device, the process continues at step 930, selecting the next one or more sets of non-volatile storage elements. If there is no next set of storage elements in the memory device, the process continues at decision step 946. If there is a next memory device for which voltages are to be determined, such as in a manufacturing environment where multiple memory devices are analyzed, the process continues at step 930. If there is no next memory device at step 946, the process ends at step 948.

For instance, each pass through the process may involve obtaining a set of voltages for a word line, a set of word lines, a block, or a set of blocks, of storage elements. For example, a given set of voltages may apply to the storage elements of an individual word line or a set of word lines, or to an individual block or a set of blocks. Moreover, note that when multiple sets of voltages, e.g., for writing, verifying and/or reading are determined, each set can apply to a different group of storage elements. For instance, one set of verify voltages may be obtained for an entire memory device, while different sets of read voltages are obtained for different blocks in the memory device. Multiple passes through the process may be performed serially or concurrently.

FIG. 10 depicts a process for accessing user data of multiple sets of non-volatile storage elements using predetermined voltages determined by the process of FIG. 9c. Step 1000 includes selecting one or more sets of non-volatile storage elements in a memory device. Steps 1002 to 1006 correspond generally to steps 920 to 924, respectively, of FIG. 9b. Step 1002 includes beginning an operation (e.g., program, verify or read) for the one or more sets of non-volatile storage elements. Step 1004 includes obtaining the corresponding set of voltages from the non-volatile storage location. Step 1006 includes accessing user data for the one or more sets of non-volatile storage elements using the corresponding set of voltages. Such accessing can include programming/verifying or reading. At decision step 1008, if there is a next set of storage elements in the memory device to access, the process continues at step 1000, where a next one or more sets of non-volatile storage elements in the memory device are selected. At decision step 1008, if there is no next set of storage elements in the memory device to access, the process ends at step 1010.

As before, each pass through the process may involve obtaining a set of voltages for a word line, a set of word lines, a block, or a set of blocks, of storage elements, and accessing the corresponding storage elements. A given set of voltages may apply to the storage elements of an individual word line or a set of word lines, or to an individual block or a set of blocks. Multiple passes through the process may be performed serially or concurrently.

Figure 11:
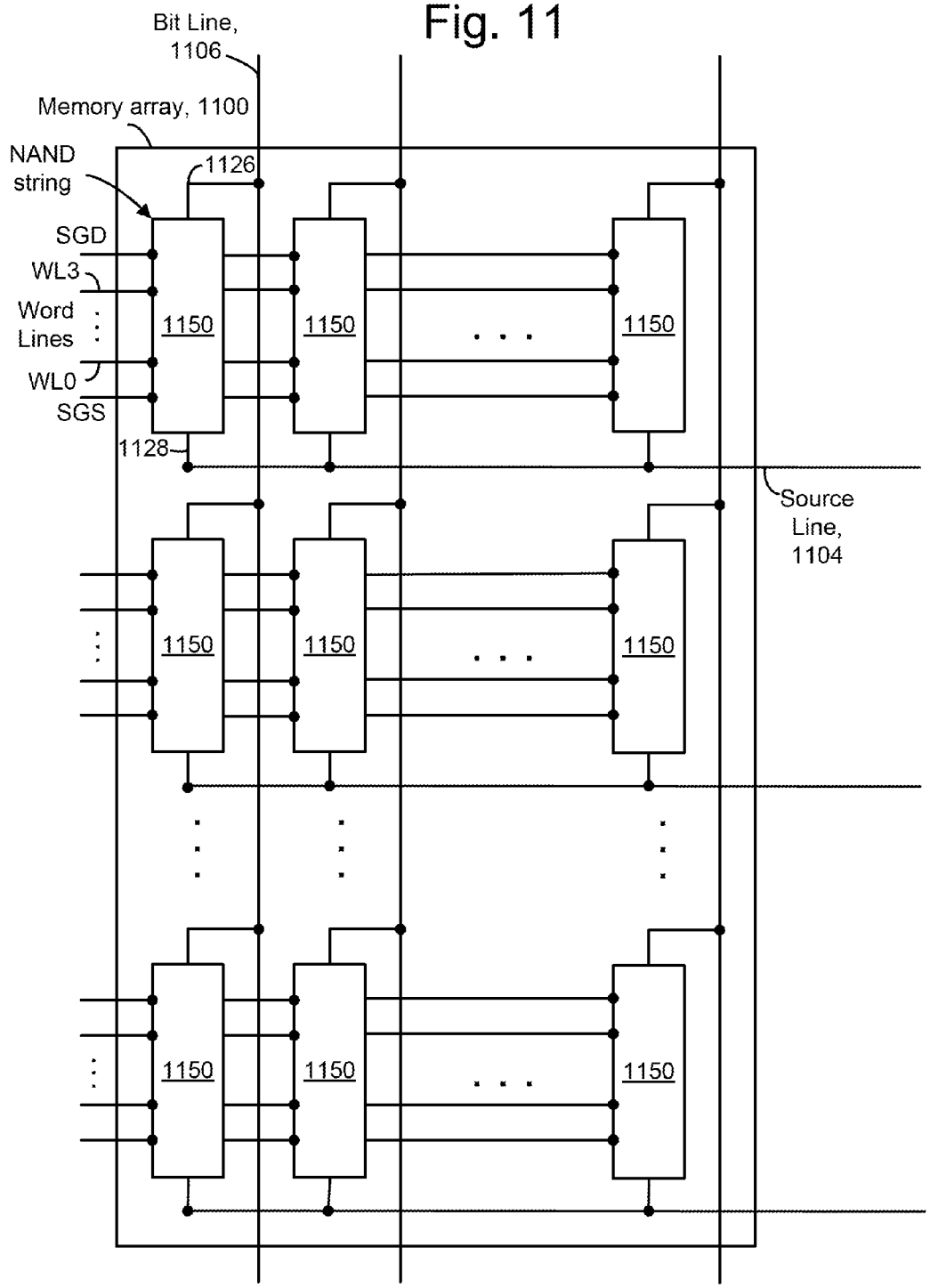
FIG. 11 is a block diagram of an array of NAND flash storage elements.

FIG. 11 is a block diagram of an array of NAND flash storage elements, such as those shown in FIGS. 1 and 2. Along each column, a bit line is coupled to the drain terminal of the drain select gate for the associated NAND string. For example, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315, 5,774,397 and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Figure 12:
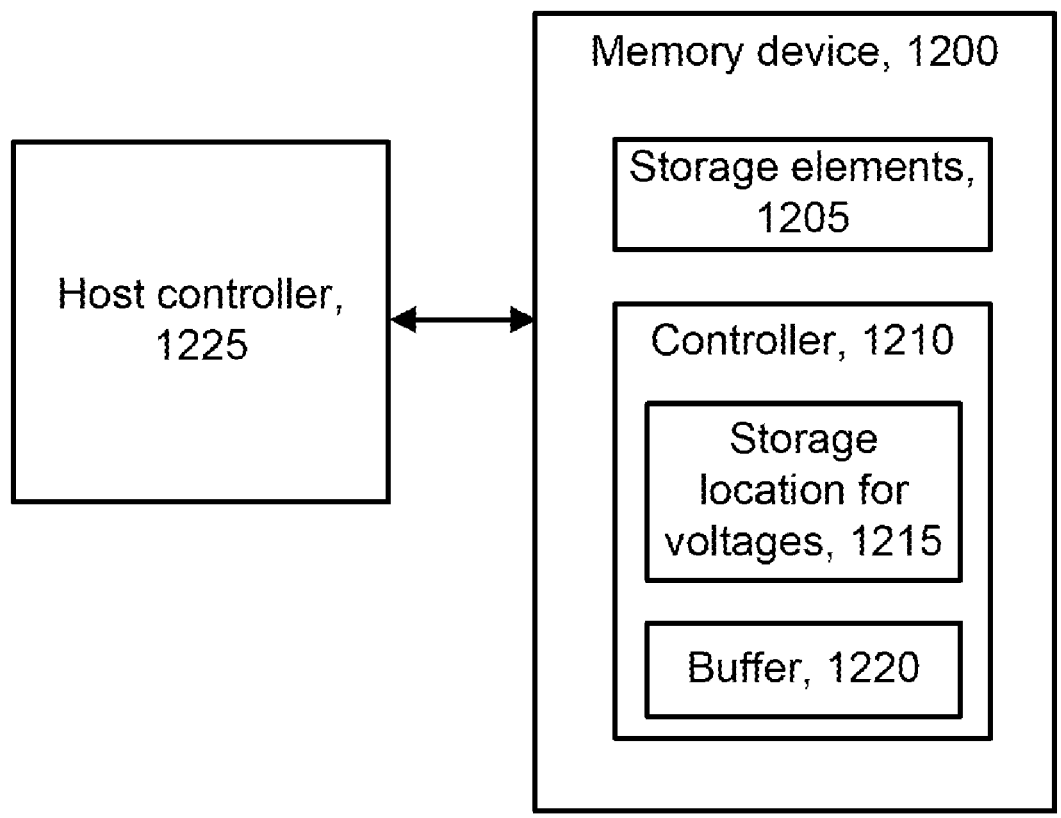
FIG. 12 depicts an overview of a host controller and a memory device.

FIG. 12 depicts an overview of a host controller and a memory device in a storage system. The memory device alone may also be considered to be a storage system. Storage elements 1205 can be provided in a memory device 1200 which has its own controller 1210 for performing operations such as programming/verifying and reading. The memory device may be formed on a removable memory card or USB flash drive, for instance, which is inserted into a host device such as a laptop computer, digital camera, personal digital assistant (PDA), digital audio player or mobile phone. The host device may have its own controller 1225 for interacting with the memory device, such as to read or write user data. For example, when reading data, the host controller can send commands to the memory device indicating an address of user data to be retrieved. The memory device controller converts such commands into command signals that can be interpreted and executed by control circuitry in the memory device. The controller 1210 may also contain a non-volatile storage location 1215 for storing sets of voltages, as discussed previously, and a buffer memory 1220 for temporarily storing user data being written to or read from the memory array. The host controller may be considered to be an entity which is outside of, or external to, the memory device. The memory device may include one or more memory die, for instance, and the host controller may be outside the one or more memory die, discussed in connection with FIG. 13.

The memory device responds to a read command by reading the data from the storage elements and making it available to the host controller. In one possible approach, the memory device stores the read data in the buffer 1220 and informs the host controller of when the data can be read. The host controller responds by reading the data from the buffer and sends another command to the memory device to read data from another address. For example the data may be read page by page. The host controller may process the read data to determine a threshold voltage distribution of the storage elements of the memory device. In another approach, control circuitry of the memory device determines the threshold voltage distribution. Further details of example embodiments of a memory device are provided below.

A typical memory system includes an integrated circuit chip that includes the controller 1210, and one or more integrated circuit chips that each contains a memory array and associated control, input/output and state machine circuits. The memory device may be embedded as part of the host system, or may be included in a memory card that is removably insertable into a mating socket of a host system. Such a card may include the entire memory device, or the controller and memory array, with associated peripheral circuits, may be provided in separate cards.

Figure 13:
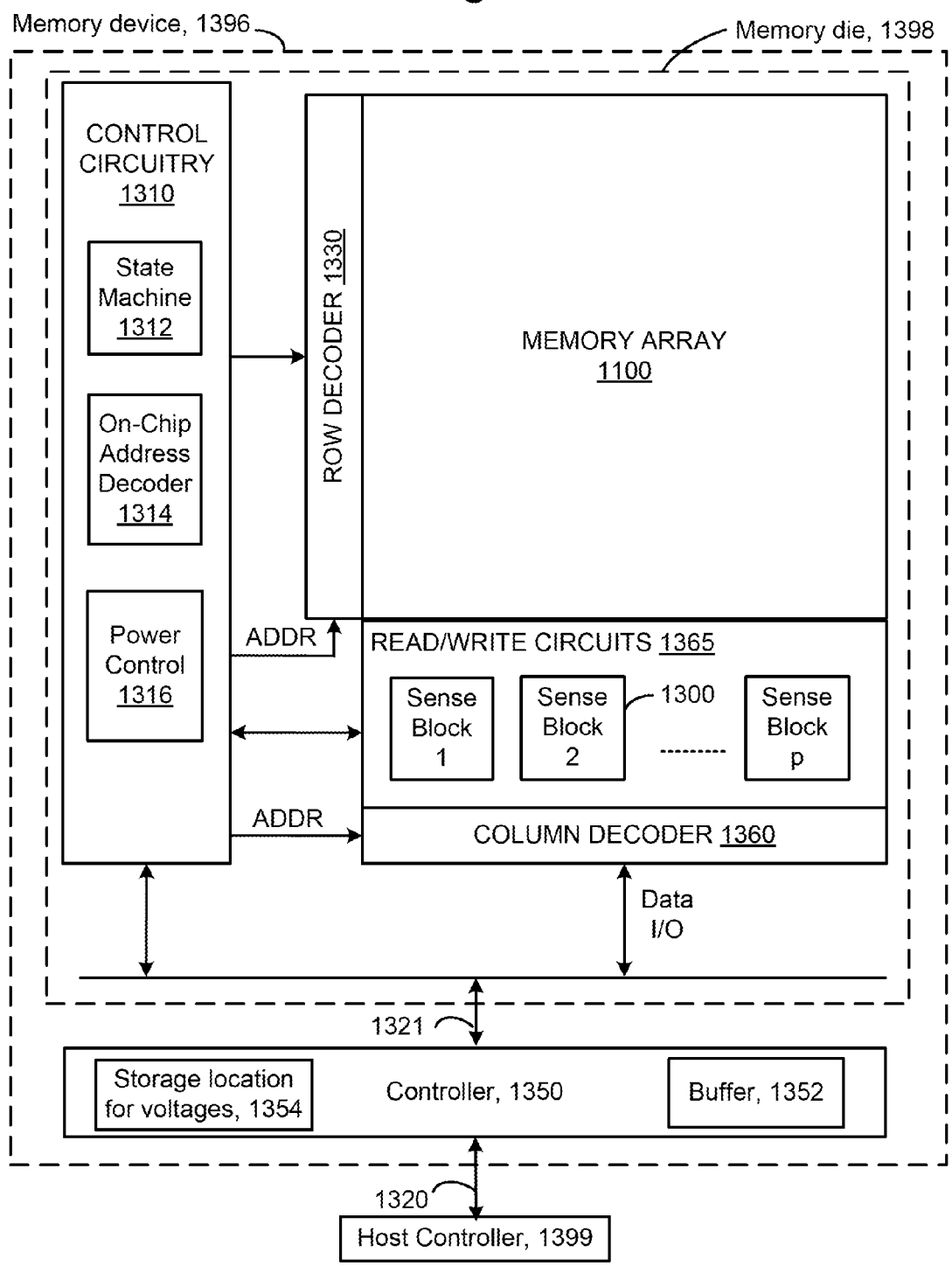
FIG. 13 is a block diagram of a non-volatile memory system using single row/column decoders and read/write circuits.

FIG. 13 is a block diagram of a non-volatile memory system using single row/column decoders and read/write circuits. The diagram illustrates a memory device 1396 having read/write circuits for reading and programming a page of storage elements in parallel, according to one embodiment of the present invention. Memory device 1396 may include one or more memory die 1398. Memory die 1398 includes a two-dimensional array of storage elements 1400, control circuitry 1310, and read/write circuits 1365. In some embodiments, the array of storage elements can be three dimensional. The memory array 1400 is addressable by word lines via a row decoder 1330 and by bit lines via a column decoder 1360. The read/write circuits 1365 include multiple sense blocks 1300 and allow a page of storage elements to be read or programmed in parallel. Typically a controller 1350 is included in the same memory device 1396 (e.g., a removable storage card) as the one or more memory die 1398. Commands and Data are transferred between the host and controller 1350 via lines 1320 and between the controller and the one or more memory die 1398 via lines 1321.

The control circuitry 1310 cooperates with the read/write circuits 1365 to perform memory operations on the memory array 1100. The control circuitry 1310 includes a state machine 1312, an on-chip address decoder 1314 and a power control module 1316. The state machine 1312 provides chip-level control of memory operations. The on-chip address decoder 1314 provides an address interface between that used by the host or a memory controller to the hardware address used by the decoders 1330 and 1360. The power control module 1316 controls the power and voltages supplied to the word lines and bit lines during memory operations. For example, the power control module 1316 can provide a control gate read voltage to a selected word line, and read pass voltages to unselected word lines, for use during read operations and in determining a threshold voltage distribution of a set of storage elements. The power control module 1316 can also provide a voltage sweep to a selected word line. The power control module 1316 may include one or more digital-to-analog converters for this purpose, for instance. In this case, the control circuitry can generate a voltage sweep without the need for external test equipment, e.g., outside the memory die 1398. This is advantageous as it allows a voltage sweep to be generated at any time, including after manufacture of the memory device, when the end user has taken possession of the memory device. Further, the memory device 1396 can include circuitry for determining the threshold voltage distribution of the storage elements so that this process can be performed internally within the memory die 1398, without the need for external test equipment or an external host. This is advantageous as it allows the threshold voltage distribution to be determined at any time without external equipment.

In some implementations, some of the components of FIG. 13 can be combined. In various designs, one or more of the components (alone or in combination), other than storage element array 1100, can be thought of as a managing or control circuit. For example, one or more managing or control circuits may include any one of, or a combination of, control circuitry 1310, state machine 1312, decoders 1314/1360, power control 1316, sense blocks 1300, read/write circuits 1365, controller 1350, host controller 1399, etc.

The data stored in the memory array is read out by the column decoder 1360 and output to external I/O lines via the data I/O line and a data input/output buffer 1352. Program data to be stored in the memory array is input to the data input/output buffer 1352 via the external I/O lines. Command data for controlling the memory device are input to the controller 1350. The command data informs the flash memory of what operation is requested. The input command is transferred to the control circuitry 1310. The state machine 1312 can output a status of the memory device such as READY/BUSY or PASS/FAIL. When the memory device is busy, it cannot receive new read or write commands.

A data storage location 1354, analogous to the storage location 1215 of FIG. 12, may also be provided in connection with the controller 1350.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for configuring a memory device, comprising:
for each of a plurality of sets of non-volatile storage elements in the memory device: measuring a threshold voltage distribution after programming the set of non-volatile storage elements, determining a programming effect based on the threshold voltage distribution, determining at least one write voltage based on the programming effect, and storing data which represents the at least one write voltage in a non-volatile storage location, where the non-volatile storage elements store at least four data states, the at least one write voltage includes at least one of an initial program voltage, a step size, and a maximum allowable program voltage, and the at least one write voltage is customized for each set of non-volatile storage elements; and
for one set of non-volatile storage elements of the plurality of sets of non-volatile storage elements: obtaining data which represents the at least one write voltage from the non-volatile storage location, and performing a write operation involving the at least one write voltage.

2. The method of claim 1, wherein:
for the one set of non-volatile storage elements, the at least one write voltage is reduced when the programming effect is stronger than average.

3. The method of claim 2, wherein:
for the one set of non-volatile storage elements, the programming effect is stronger than average when threshold voltages for lower data states in the threshold voltage distribution are above an expected value.

4. The method of claim 2, wherein:
for the one set of non-volatile storage elements, the programming effect is stronger than average when a width in the threshold voltage distribution is higher than expected.

5. The method of claim 1, wherein:
for the one set of non-volatile storage elements, the determining at least one write voltage includes increasing the at least one write voltage when the programming effect is weaker than average.

6. The method of claim 5, wherein:
for the one set of non-volatile storage elements, the programming effect is weaker than average when a maximum allowable program voltage is reached before the non-volatile storage elements have been programmed to correspondent data states.

7. The method of claim 1, wherein:
the at least one write voltage is an initial program voltage.

8. The method of claim 1, wherein:
the at least one write voltage is a step size.

9. The method of claim 1, wherein:
the at least one write voltage is a maximum allowable program voltage.

10. The method of claim 1, wherein:
for the one set of non-volatile storage elements, the determining at least one write voltage includes reducing the at least one write voltage when widths in the threshold voltage distribution are wider than average, the at least one write voltage is a step size which is reduced.

11. The method of claim 1, wherein:
each set of non-volatile storage elements includes a different set of one or more blocks in the memory device.

12. The method of claim 1, wherein:
each set of non-volatile storage elements includes a different set of one or more word lines in the memory device.

13. The method of claim 1, wherein:
the threshold voltage distribution includes each of the four or more data states, for each set of non-volatile storage elements.

14. An apparatus which performs the method of claim 1.

15. A method for configuring a memory device, comprising:
for each of a plurality of sets of non-volatile storage elements in the memory device: measuring a threshold voltage distribution after programming the set of non-volatile storage elements, determining an amount of program disturb based on the threshold voltage distribution, determining a set of sensing voltages based on the amount of program disturb, storing data which represents the set of sensing voltages in a non-volatile storage location, where the non-volatile storage elements store at least four data states, and the set of sensing voltages is customized for each set of non-volatile storage elements; and
for one set of non-volatile storage elements of the plurality of sets of non-volatile storage elements: obtaining data which represents the set of sensing voltages from the non-volatile storage location, and performing a sensing operation involving the set of sensing voltages.

16. The method of claim 15, wherein:
the set of sensing voltages comprises read voltages.

17. The method of claim 15, wherein:
the set of sensing voltages comprises verify voltages.

18. The method of claim 15, wherein:
for the one set of non-volatile storage elements, the amount of program disturb is based on a width of an erased state of the threshold voltage distribution.

19. The method of claim 15, wherein:
for the one set of non-volatile storage elements, the determining a set of sensing voltages includes modifying a verify voltage level of a highest data state of the threshold voltage distribution based on the amount of program disturb, and determining a voltage window based on the verify voltage level of the highest data state.

20. The method of claim 19, wherein:
the verify voltage level of the highest data state is reduced when the amount of program disturb is relatively high.

21. The method of claim 19, where the set of sensing voltages comprises verify voltages, and the determining a set of sensing voltages includes, for the one set of non-volatile storage elements, determining the verify voltages from a function which provides a desired relative spacing between the verify voltages within a constraint of the voltage window.

22. The method of claim 15, wherein:
for the one set of non-volatile storage elements, the determining a set of sensing voltages is based on data retention characteristics of the one set of non-volatile storage elements.

23. The method of claim 15, wherein:
for the one set of non-volatile storage elements, the determining a set of sensing voltages includes determining a voltage window based on a voltage level of a highest data state of the threshold voltage distribution, where the verify voltage level of the highest data state is fixed at a default level regardless of the amount of program disturb.

24. An apparatus which performs the method of claim 15.

25. A method for configuring a memory device, comprising:
for each of a plurality of sets of non-volatile storage elements in the memory device: measuring a threshold voltage distribution after programming the set of non-volatile storage elements, determining at least one voltage based on the threshold voltage distribution, and storing respective data which represents the at least one voltage in a respective position of a non-volatile storage location, where the non-volatile storage elements store at least four data states, the at least one voltage is customized for each set of non-volatile storage elements, and the respective position of the non-volatile storage location identifies the set of non-volatile storage elements to which the respective data applies; and
for one set of non-volatile storage elements of the plurality of sets of non-volatile storage elements: obtaining the respective data which represents the at least one voltage from the non-volatile storage location, and performing at least one of a writing operation and a sensing operation involving the at least one voltage.

26. The method of claim 25, wherein:
each set of non-volatile storage elements comprises at least one block of non-volatile storage elements, and different respective positions in the non-volatile storage location correspond to different blocks of non-volatile storage elements.

27. The method of claim 25, wherein:
the non-volatile storage location is in a block of non-volatile storage elements, and different respective positions in the non-volatile storage location correspond to different word lines or sets of word lines of non-volatile storage elements in the block.

28. The method of claim 25, wherein:
for the one set of non-volatile storage elements, the determining the at least one voltage is repeated at different times after a time of manufacture of the memory device.

29. An apparatus which performs the method of claim 25.

* * * * *